United States Patent [19]
Fujita et al.

[11] Patent Number: 5,564,194
[45] Date of Patent: Oct. 15, 1996

[54] GEOMAGNETIC DIRECTION SENSOR

[75] Inventors: Masayoshi Fujita; Takehiro Nagaki, both of Miyagi, Japan

[73] Assignee: Sony Corporation, Japan

[21] Appl. No.: 449,818

[22] Filed: May 24, 1995

[30] Foreign Application Priority Data

May 31, 1994 [JP] Japan .................................. 6-119415

[51] Int. Cl.⁶ .................................................. G01C 17/28
[52] U.S. Cl. ........................................ 33/355 R; 33/361
[58] Field of Search ........................... 33/355 R, 356, 33/357, 361, 363 R

[56] References Cited

U.S. PATENT DOCUMENTS

| | | | |
|---|---|---|---|
| 2,585,956 | 2/1952 | McCarthy | 33/356 |
| 2,815,499 | 12/1957 | Brynes | 33/361 |
| 2,823,545 | 2/1958 | Bodge | 33/361 |
| 4,763,072 | 8/1988 | Katoh et al. | 33/361 |
| 5,091,697 | 2/1992 | Roth et al. | 33/361 |

Primary Examiner—Christopher W. Fulton
Attorney, Agent, or Firm—Ronald P. Kananen

[57] ABSTRACT

A geomagnetic direction sensor has a substrate, at least two magneto-resistive effect devices and a coil for generating the bias magnetic field. The substrate retains shape symmetry when rotated through 90° and includes plural magnetic cores for converging the geomagnetism. The magnetic cores are arrayed circumferentially of the substrate and interconnected with one another by a non-magnetic material. At least two magneto-resistive effect devices are provided in register with the magnetic gaps so as to be substantially at right angles to one another and to the direction of the magnetic field of the geomagnetism in the magnetic gap region. The substrate also includes a coil for generating a bias magnetic field for impressing a bias magnetic field to each of the magneto-resistive effect devices.

22 Claims, 8 Drawing Sheets

GEOMAGNETIC DIRECTION SENSOR

BACKGROUND

1. Field of the Invention

This invention relates to a geomagnetic azimuth angle sensor or direction sensor and a method for manufacturing the same. More particularly, it relates to a geomagnetic azimuth angle or direction sensor exploiting magneto-resistance effects, and a method for manufacturing the same. It is noted that, the term "direction" herein means a direction relative to the direction of geomagnetism, and the term "azimuth angle" herein means the angle between a direction and the direction of geomagnetism.

2. Background of the Invention

In a color cathode ray tube, for example, it is a frequent occurrence that the trajectory of an electron beam radiated from an electron gun is sent by geomagnetism, thus causing variations in the beam landing position on a phosphor surface. With a high definition cathode ray tube, such changes in the landing, that is, a position deviation, give rise to problems such as deterioration in color purity.

For correcting such changes in the beam landing position, a landing correction coil is usually mounted on the cathode ray tube. An optimum current necessary for landing correction is automatically caused to flow through the landing correction coil depending on the geomagnetic direction for controlling the electron beam trajectory for prohibiting mistaken landing.

Thus, for landing correction, it is necessary to detect the geomagnetic direction accurately. To this end, a geomagnetic direction sensor is employed.

The geomagnetic direction sensor is also employed as a portable goniometer in place of a conventional magnet type goniometer or magnetic compass.

The representative structure of the geomagnetic direction sensor, employed for a number of purposes, may be classified into a so-called flux gate type and a magneto-resistive type (MR type).

The flux gate type geomagnetic direction sensor is comprised of a coil for outputting electrical signals 102 and an excitation coil 103, both wound on a permalloy core 101, as shown in FIG. 1. The flux gate type geomagnetic direction sensor is of such a construction in which the earth's magnetism is collected by the permalloy core and transmitted to the coil for outputting the electrical signal 102.

With the flux gate type geomagnetic direction sensor, an ac bias magnetic field is generated by the excitation coil 103 in the permalloy coil 101 and a pulsed voltage generated on bias magnetic field inversion is detected as a signal. Since the pulsed voltage is changed in magnitude depending on the geomagnetic direction, the geomagnetic direction sensor may be utilized as a geomagnetic sensor.

However, since the flux gate type geomagnetic direction sensor converts the geomagnetism into electrical signals by the coil, it is necessary to increase the number of turns of the coil for outputting the electrical signals 102 for improving sensitivity, while it is necessary to enlarge the size of the permalloy core 101 for improving flux-converging effects. Thus, it is difficult to reduce the size of the flux gate type sensor or to reduce its production cost.

On the other hand, the MR type geomagnetic sensor is comprised of a MR sensor chip 110, having formed thereon magneto-resistive effect devices (MR devices) 111 and introduced into an air-core coil 112, is so arranged that an ac bias magnetic field $H_B$ in a 45° direction with respect to the MR devices 111 is applied to the MR sensor chip 110, as shown in FIG. 2. There is shown in FIG. 3 an equivalent circuit of the MR type geomagnetic sensor. When the MR sensor is employed as the geomagnetic direction sensor, a pair of the MR sensors shown in FIG. 2 are mounted so that the winding directions of the air-core coils run at right angles to each other.

The MR type geomagnetic direction sensor, making use of the MR sensors, is higher in sensitivity than the flux gate type geomagnetic direction sensor. However, the MR type geomagnetic direction sensor is not satisfactory in sensing the geomagnetic direction on the order of 0.3 gauss since the geomagnetism is sensed solely by the MR sensor chip.

In addition, since the bias magnetic field $H_B$ in the 45° direction is applied to the MR devices 110, and an MR characteristic curve is forcedly raised at an acute slope for improving sensitivity, the MR type geomagnetic direction sensor exhibits hysteresis in MR characteristics which has to be eliminated by a complicated signal processing circuit. The MR type sensor also has a defect that the direction sensing sensitivity is low and even amounts to ±10°.

As discussed above, the conventional geomagnetic direction sensor is unsatisfactory in sensitivity, while it is difficult to reduce its size or production cost.

SUMMARY OF THE INVENTION

It is therefore an object of the present invention to provide a geomagnetic direction sensor which resolves the above-mentioned problems.

It is another object of the present invention to provide a method for producing a geomagnetic direction sensor which resolves the above-mentioned problems.

In one aspect, the present invention provides a geomagnetic direction sensor having a substrate including a plurality of cores of a magnetic material for converging geomagnetism, and detection means for detecting changes in the magnetic field of the geomagnetism. The cores are arrayed circumferentially of the substrate and interconnected by a non-magnetic material for defining pre-set gaps therebetween. The detection means are arrayed in registration with the gaps in the substrate so as to be substantially perpendicular to the direction of the magnetic field of the geomagnetism in the gaps for detecting changes in the magnetic field of the geomagnetism depending on magneto-resistive effects.

In another aspect, the present invention provides a geomagnetic direction sensor having a substrate including a plurality of cores of a magnetic material for converging geomagnetism and having a shape which remains symmetrical on rotation, and at least two magneto-resistive devices arrayed substantially perpendicularly to each other on said substrate. The cores are arrayed circumferentially of the substrate and are interconnected by a non-magnetic material for defining pre-set gaps therebetween. The magneto-resistive effect devices are arrayed in register with the gaps of the substrate so as to be substantially perpendicular to the direction of the magnetic field of the geomagnetism in the gaps. A bias magnetic field generating coil is provided on the substrate for impressing a bias magnetic field to the magneto-resistive effect device.

In still another aspect, the present invention provides a method for producing a geomagnetic direction sensor having the steps of forming plural grooves on one major surface of a plate-shaped member formed of a magnetic material, charging a non-magnetic material in these grooves, grinding the major surface of the plate-shaped member opposite to the major surface in which the grooves have been formed, forming a plurality of magneto-resistive effect devices on the one major surface of said plate-shaped member, and severing the plate-shaped member into a plurality of the geomagnetic direction sensors each including one of the magneto-resistive devices.

The present invention thus provides a geomagnetic direction sensor which is small-sized and easy to assemble and which exhibits practically satisfactory sensitivity.

DESCRIPTION OF THE INVENTION

Figure 1:
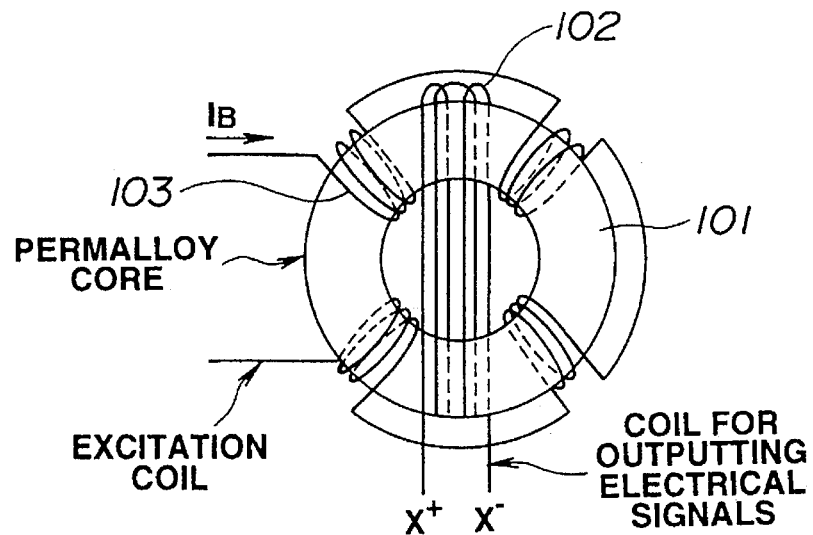
FIG. 1 is a schematic plan view showing an embodiment of a conventional flux gate type geomagnetic direction sensor.
Figure 2:
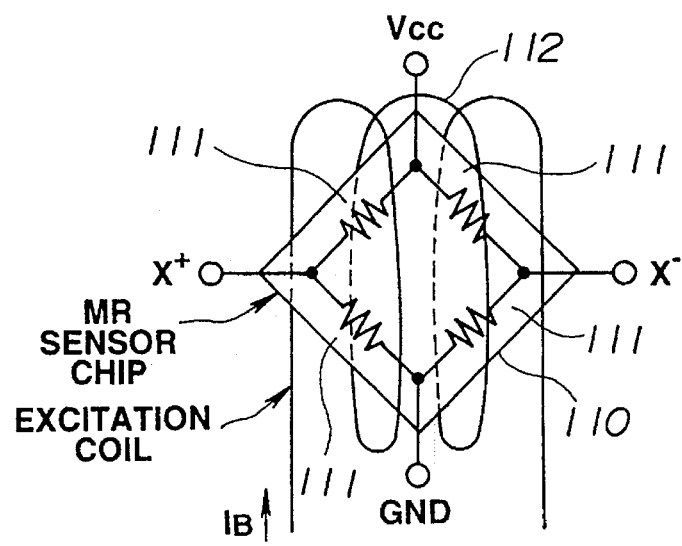
FIG. 2 is a schematic plan view showing an embodiment of an MR type geomagnetic direction sensor.
Figure 3:
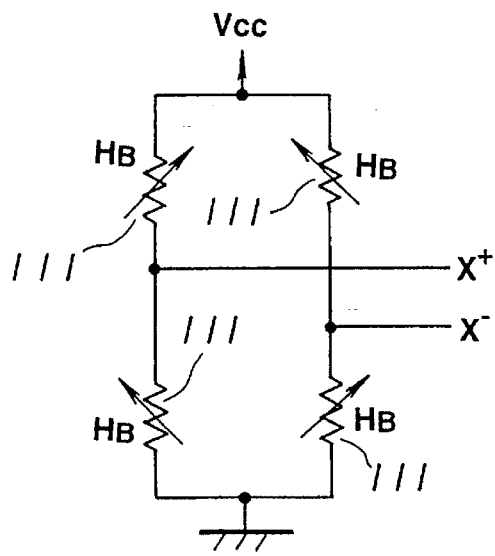
FIG. 3 is an equivalent circuit diagram of the geomagnetic direction sensor shown in FIG. 2.

Referring to the drawings, illustrative embodiments of the present invention will be explained in detail.

Figure 4:
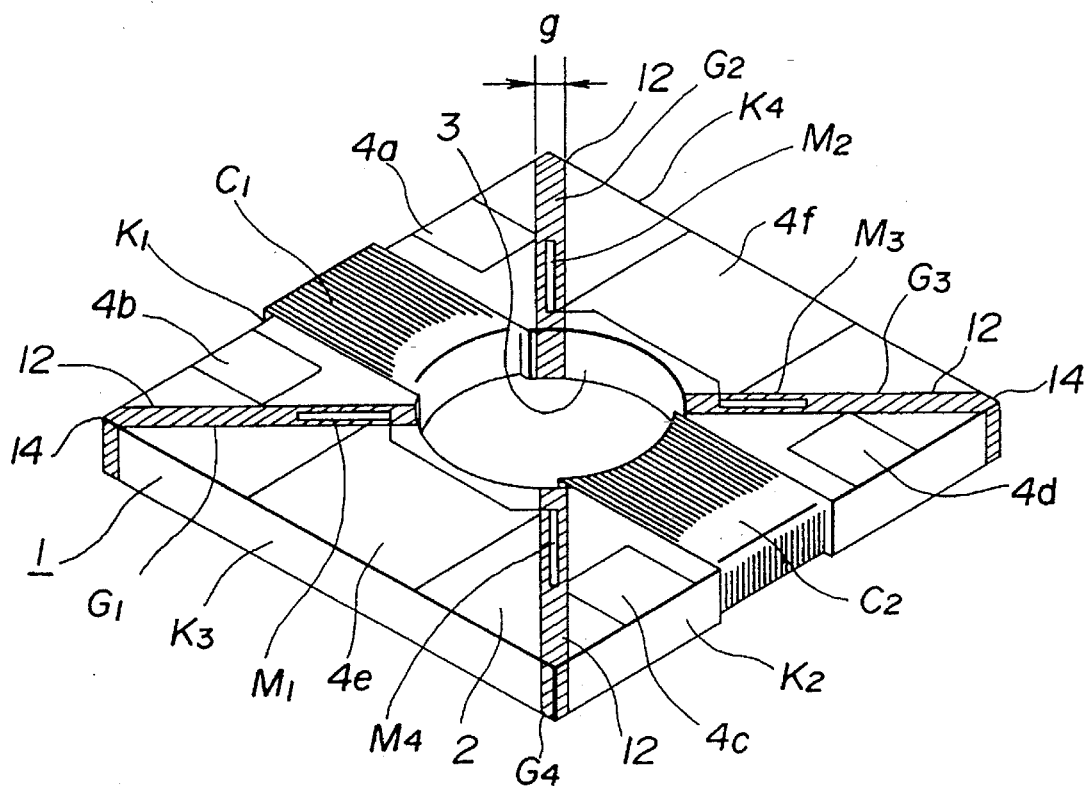
FIG. 4 is a schematic perspective view showing an embodiment of a geomagnetic direction sensor embodying the present invention.

FIG. 4 shows an example of a basic structure of the geomagnetic direction sensor embodying the present invention.

The present geomagnetic direction sensor is comprised of a sensor substrate 1, an insulating film 2 formed thereon and MR sensors $M_1$, $M_2$, $M_3$ and $M_4$. The sensor substrate 1 is formed by four ferrite magnetic cores $K_1$, $K_2$, $K_3$ and $K_4$ arranged so as to be combined together at an interval of 90° to form a square shape having magnetic gaps $G_1$, $G_2$, $G_3$ and $G_4$ of pre-set width g. The insulating film 2 of $SiO_2$ is deposited on the overall surface of the sensor substrate 1. On the insulating film 2, there are deposited the magneto-resistive (MR) devices $M_1$, $M_2$, $M_3$ and $M_4$ at pre-set positions for facing the magnetic gaps $G_1$, $G_2$, $G_3$ and $G_4$, respectively.

In the geomagnetic azimuth sensor shown in FIG. 4, at least two magneto-resistive effect devices, referred to herein as MR sensors, are provided at right angles to each other for producing an output along the x-axis and an output along a y-axis which outputs are at right angles to each other. In the present embodiment, the four MR sensors $M_1$, $M_2$, $M_3$ and $M_4$ are provided at equiangular Intervals of 90° relative to one another.

On the other hand, the magnetic cores $K_1$, $K_2$, $K_3$ and $K_4$ are arrayed along the periphery of the sensor substrate 1 at an equiangular interval of e.g., 90° depending on the array of the MR sensors for defining magnetic gaps therebetween and also for defining a closed magnetic path. The magnetic cores $K_1$, $K_2$, $K_3$ and $K_4$ are preferably arrayed so that a symmetrical structure of the cores is retained on rotation thereof through 90°.

Specifically, the cores are arrayed in a toroidal or a square shape. In the embodiment shown in FIG. 4, the cores are arrayed in a square shape.

The magnetic cores $K_1$, $K_2$, $K_3$ and $K_4$ are formed of soft magnetic materials exhibiting high magnetic permeability and high saturation magnetic flux density, such as permalloy, silicon steel plates or a variety of soft ferrite materials. The magnetic cores $K_1$, $K_2$, $K_3$ and $K_4$ are employed for impressing a bias magnetic field and converging the geomagnetic flux.

Thus, excitation coils are wound on the magnetic cores $K_1$, $K_2$, $K_3$ and $K_4$, as explained subsequently, and the electric current $I_B$ is caused to flow therethrough for generating a bias magnetic field $H_B$ so that straight portions of high magnetic sensitivity of the characteristic curve of the MR sensors $M_1$, $M_2$, $M_3$ and $M_4$ will be employed. The current $I_B$ producing the bias magnetic field $H_B$ may be ac or dc as desired.

The sensor substrate 1 is made up of the magnetic cores $K_1$, $K_2$, $K_3$ and $K_4$ which are bonded to one another with, e.g., glass material to present a square shape when seen in plan view. That is, the gaps of $G_1$, $G_2$, $G_3$ and $G_4$ of a pre-set width are filled with a glass material. A through-hole 3, by which excitation coils are wound as will be explained subsequently, is bored at the center of the sensor substrate 1 for impressing a pre-set bias magnetic field to the MR sensors $M_1$, $M_2$, $M_3$ and $M_4$. On the sensor substrate 1, the insulating film 2 is formed as explained previously. On the insulating film 2, there are formed in position the MR sensors $M_1$, $M_2$, $M_3$ and $M_4$ and six electrodes 4a to 4f for interconnecting the MR sensors $M_1$, $M_2$, $M_3$ and $M_4$ with external electrodes, not shown.

Of the magnetic cores $K_1$, $K_2$, $K_3$ and $K_4$, the cores $K_1$ and $K_2$ are wound with excitation coils $C_1$ and $C_2$, respectively. The excitation coils $C_1$, $C_2$ impress the bias magnetic field $H_B$ in a perpendicular direction to the MR sensors $M_1$, $M_2$, $M_3$ and $M_4$ arrayed on the magnetic gaps $G_1$, $G_2$, $G_3$ and $G_4$. The MR sensors $M_1$, $M_2$, $M_3$ and $M_4$ in the insulating film in the gaps $G_1$, $G_2$, $G_3$ and $G_4$. Thus the bias magnetic field $H_B$ is impressed substantially in parallel with respect to the film surfaces of the MR sensors $M_1$, $M_2$, $M_3$ and $M_4$.

The magnitude of the current $I_B$ supplied to the excitation coils $C_1$, $C_2$ is less than the saturation magnetic flux density and up to close to the magnetic permeability of a magnetic portion. That is a closed magnetic path defined by the magnetic cores $K_1$, $K_2$, $K_3$ and $K_4$, thereby avoiding the range of rotation magnetization and providing allowance in the magnetization of the magnetic portion as well as for providing means for converging the geomagnetic flux.

If an ac bias is used for the MR sensors $M_1$, $M_2$, $M_3$ and $M_4$, the direction signal of a low frequency may be taken out as an electrical signal superimposed on the ac signal of a higher frequency. Thus, the offset produced by the MR sensors $M_1$, $M_2$, $M_3$ and $M_4$ or noise components such as temperature drift may be eliminated by a high-pass filter (HPF), thus indicating a direction with high accuracy.

The MR sensors $M_1$, $M_2$, $M_3$ and $M_4$ are classified into the two MR sensors $M_1$, $M_3$ for sensing the x-axis direction and the two sensors $M_2$, and $M_4$ for sensing the y-axis direction running at right angles to the x-axis direction.

In the present embodiment, additional MR sensors for correcting temperature characteristics, such as a neutral-point potential, not shown, may be connected to the MR sensors $M_1$, $M_2$, $M_3$ and $M_4$. In that case, the additional MR sensors for correcting temperature characteristics are preferably arranged outside the magnetic gaps, that is, on the magnetic cores $K_1$, $K_2$, $K_3$ and $K_4$, to be perpendicular to the MR sensors $M_1$, $M_2$, $M_3$ and $M_4$, and parallel to magnetic signals in the magnetic cores $K_1$, $K_2$, $K_3$ and $K_4$, for thereby improving the S/N ratio and the direction detecting accuracy.

Figure 5:
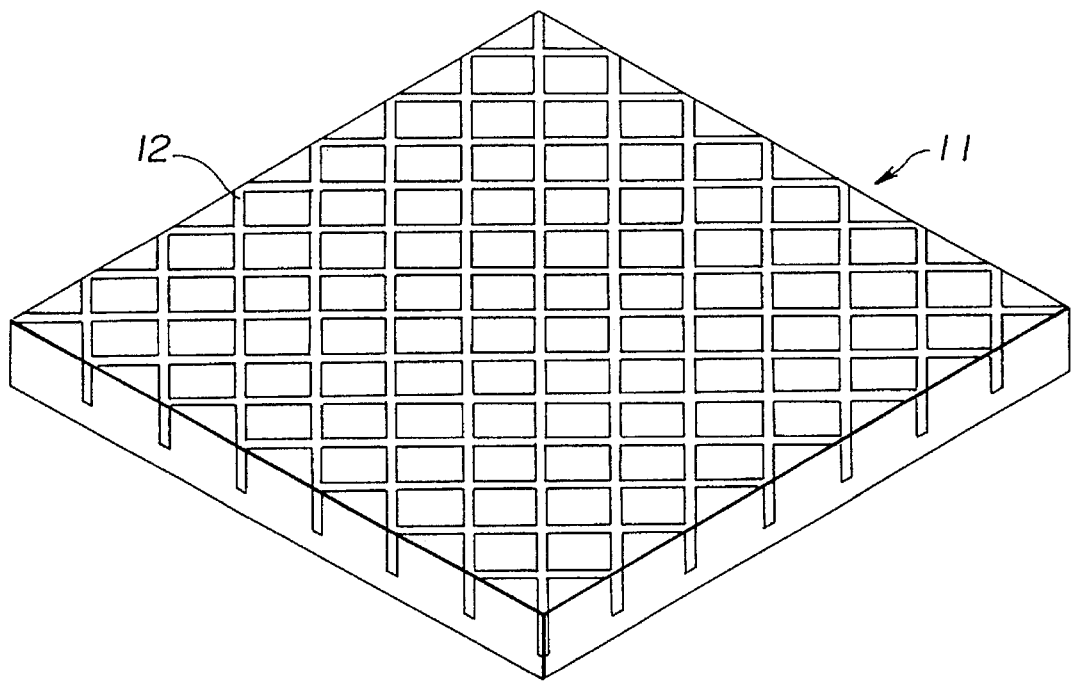
FIG. 5 is a schematic perspective view showing groves formed in a master plate.

For producing the geomagnetic direction sensor, plural grooves 12 are formed on a master plate 11 formed of a magnetic material, herein ferrite, as shown in FIG. 5. These grooves 12 are formed in a lattice fashion with a pre-set width and with a pre-set interval, as shown in FIG. 5.

In these grooves 12 is then charged a non-magnetic material, herein a glass material. Then, circular-shaped openings 3, centered about points of intersection of the grooves 12, are formed through the master plate 11 by employing laser machining techniques for completing the substrate 21. It is also, possible to form the grooves 12 and the openings 3 in the master plate 11 by powdered press molding press or mold forming and subsequently to charge the glass material in the grooves 12.

Figure 6:
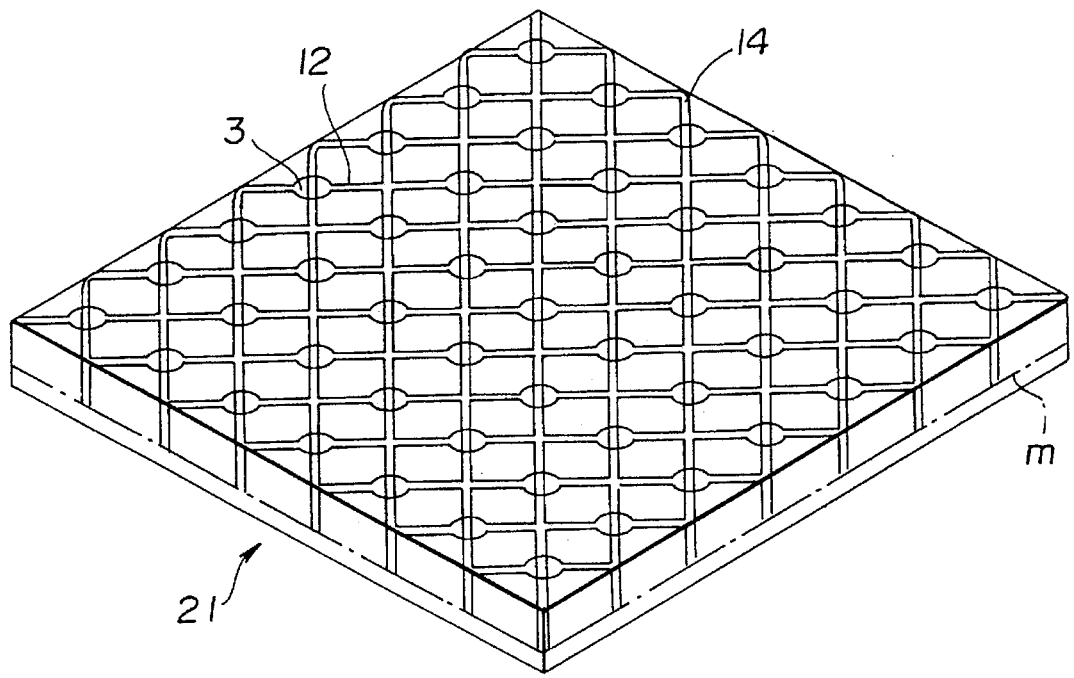
FIG. 6 is a schematic view showing how plural openings are formed at pre-set positions in the master plate, in which the grooves are previously formed, for forming a substrate.

The lower major surface of the substrate 21 is then ground until the bottom of the grooves 12 charged with the non-magnetic material 14 is exposed, for example, up to a position indicated by a chain-dotted line m in FIG. 6. The MR sensors $M_1$, $M_2$, $M_3$ and $M_4$ may be formed at the next step on a desired one major surface of the major surfaces of the substrate 21. It is however more preferred to form the MR sensors $M_1$, $M_2$, $M_3$ and $M_4$ on the ground major surface because the surface of the non-magnetic material 14 charged in the grooves 12 on the ground surface is free of step differences so that the ground major surface is planarized in its entirety.

The selected major surface of the substrate 21 is then ground and polished to form a planar surface on which a non-magnetic film, herein an insulating film formed of $SiO_2$, is then formed.

Figure 7:
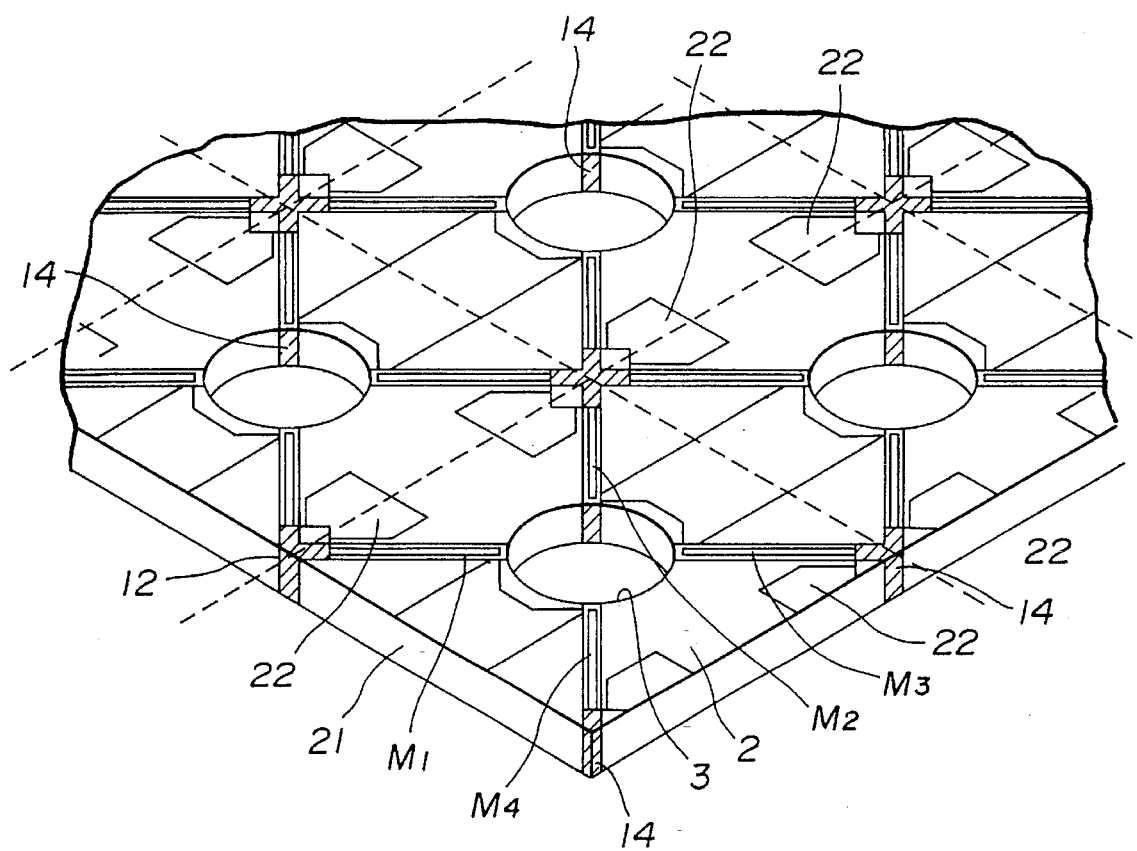
FIG. 7 is an enlarged fragmentary perspective view showing a non-magnetic film formed on the substrate and respective MR sensors and electrodes formed at pre-set positions on the non-magnetic film.

A pre-set number of the MR sensors $M_1$, $M_2$, $M_3$ and $M_4$ are then formed at pre-set positions on the insulating film 2 in register with the grooves 12 charged with the glass material employed as the non-magnetic material 14, as shown in FIG. 7. Also a pre-set number of electrodes 22, operating as four electrodes 4a to 4d for connecting the MR sensors $M_1$, $M_2$, $M_3$ and $M_4$ to external electrodes, are formed at pre-set four positions on the insulating film 2.

After formation of the MR sensors $M_1$, $M_2$, $M_3$ and $M_4$ and the electrodes 22 on the substrate 21, the substrate is cut along lines interconnecting the points of intersections of the grooves 12, that is, along broken lines shown in FIG. 7, for forming plural sensor chips. The portions of the sensor chip corresponding to the magnetic cores $K_1$, $K_2$, $K_3$ and $K_4$ are wound with excitation coils $C_1$, $C_2$, as shown in FIG. 4, thus completing the geomagnetic direction sensor having a structure shown in FIG. 4.

Figure 8:
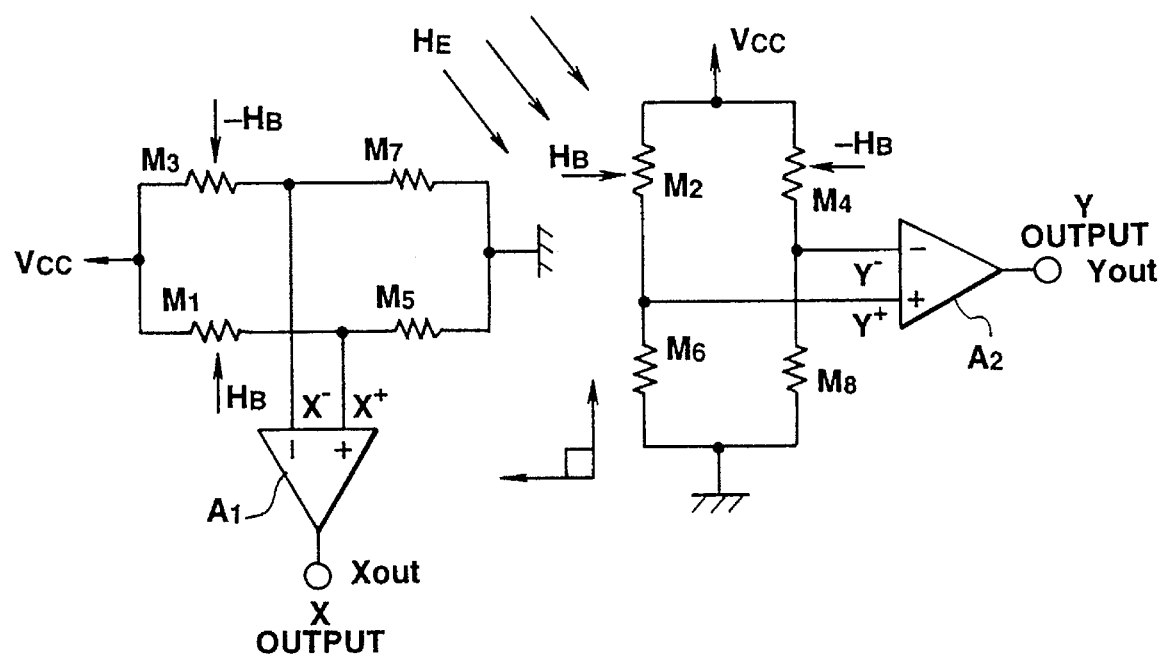
FIG. 8 is an equivalent circuit diagram of the geomagnetic direction sensor shown in FIG. 7.

The equivalent circuit of the geomagnetic direction sensor having the above structure is shown in FIG. 8. That is, with the MR sensors $M_1$, $M_3$ for detecting the X-axis, an X-axis output is issued by a differential amplifier $A_1$.

Similarly, with the MR sensors $M_2$, $M_4$ for detecting the Y-axis, a Y-axis output is issued by a differential amplifier $A_2$.

A constant-potential power source $V_{cc}$ is connected to the MR sensors $M_1$, $M_2$, $M_3$ and $M_4$ for sensing the geomagnetism, whereby a sense current $I_B$ is supplied to the MR sensors $M_1$, $M_2$, $M_3$ and $M_4$.

On the other hand, bias magnetic fields $H_B$ and $-H_B$ having azimuthal directions different by 180° from each other are impressed on the MR sensor $M_1$ and the MR sensor $M_3$ for sensing the x-axis, respectively. Similarly, bias magnetic fields $H_B$ and $-H_B$ having azimuthal directions different by 180° from each other are impressed on the MR sensor $M_2$ and the MR sensor $M_4$ for sensing the y-axis, respectively.

With the above-described geomagnetic direction sensor, the MR sensors $M_1$, $M_2$, $M_3$ and $M_4$ are characterized by (i) the magneto-resistive effects in which the resistance value is changed with the intensity of the magnetic field; (ii) a high ability of sensing a magnetic field of lower intensity; and (iii) capability of taking out changes in resistance as an electrical signal.

The geomagnetic direction sensor of the present invention takes advantage of the above characteristics of the MR sensors for converting magnetic signals derived from geomagnetism into electrical signals.

Figure 9:
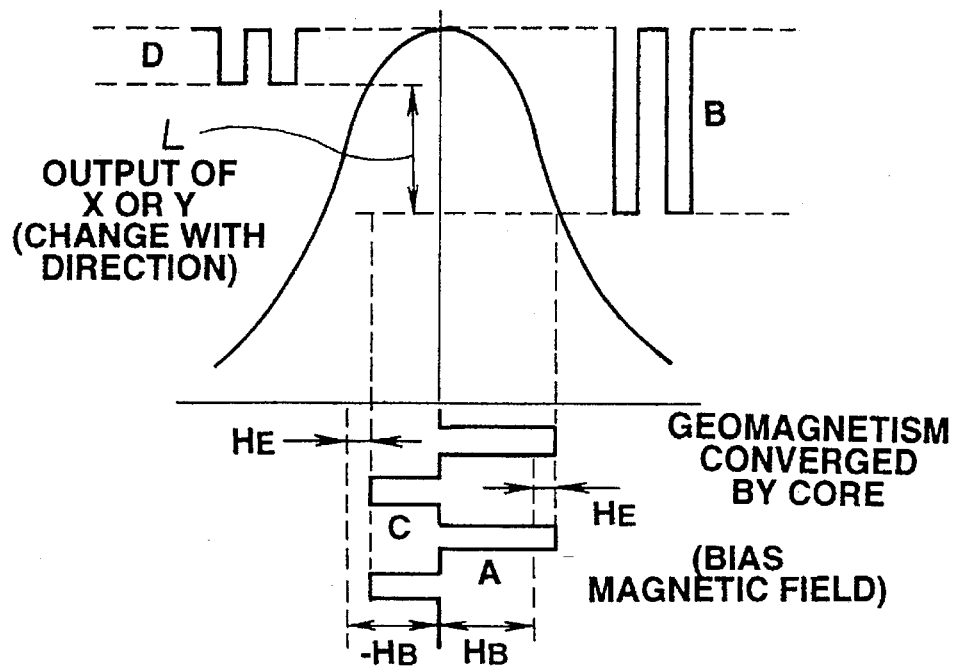
FIG. 9 is a graph showing MR characteristics of an MR sensor.

The MR characteristics of the MR sensor are shown in FIG. 9, in which, with the dc current being caused to flow in the MR sensor, the abscissa and the ordinate denote the intensity of the magnetic field applied perpendicularly to the MR sensor and changes in resistance of the MR sensor or changes in an output voltage, respectively.

The resistance value of the MR sensor becomes maximum for the zero magnetic field, becoming lower by about 3% on application of a larger magnetic field of the order of 100 to 200 gauss, depending, e.g., on the pattern shape of the MR sensor.

For improving the S/N ratio (output voltage amplitude) of the MR sensor output and the distortion factor, the bias magnetic field $H_B$ is necessitated, as shown in FIG. 9. Such bias magnetic field $H_B$ is derived by flowing the current $I_B$ through the excitation coils $C_1$, $C_2$ respectively wound on the magnetic cores $K_1$, $K_2$, as explained previously.

The direction of the bias magnetic field applied across the MR sensor $M_1$ for sensing the x-axis direction at this time and that of the bias magnetic field applied across the MR sensor $M_3$ are inverted 180° relative to each other. Similarly, the bias magnetic field applied across the MR sensor $M_2$ for sensing the x-axis direction and that of the bias magnetic field applied across the MR sensor $M_4$ are inverted 180° relative to each other. If the geomagnetism $H_E$ is impressed to the direction sensor, the intensity of the bias magnetic field impressed on the MR sensor $M_1$ for the x-axis becomes equal to $H_B+H_E$, while that of the bias magnetic field impressed on the MR sensor $M_3$ becomes equal to $-H_B+H_E$.

If the ac bias magnetic field is impressed on the MR sensor, the magnetic field impressed on the MR sensor $M_1$ is changed as shown at A in FIG. 9. Such change in the magnetic field results in a change in voltage as indicated at B in FIG. 9. On the other hand, the magnetic field impressed on the MR sensor $M_3$ is changed as shown at C in FIG. 9. Such change in the magnetic field results in a change in voltage as indicated at D in FIG. 9.

An output difference L between the output B from the MR sensor $M_1$ and the output D from the MR sensor $M_3$ in FIG. 9 is taken out as a differential signal (X-output). Similarly, a differential signal (Y-output) is taken out from the MR sensors $M_2$ and $M_4$ for the y-axis.

Figure 10:
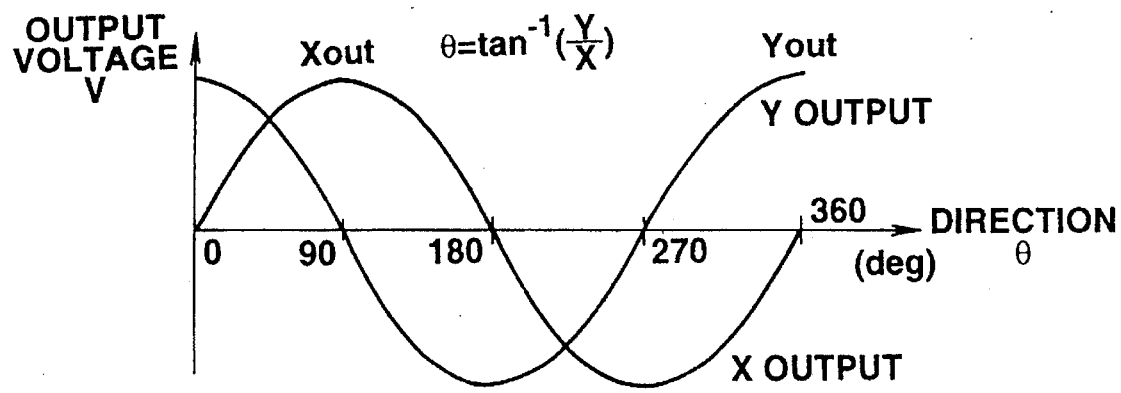
FIG. 10 is a graph showing the relation between an output voltage of the direction sensor and the direction.

These differential signals, that is, the X-output and the Y-output, are varied with the direction of geomagnetism $H_E$ and are proportional to $H_E \sin\theta$ and $H_E \cos\theta$, where $\theta$ is the direction relative to the geomagnetism $H_E$, or azimuth angle, respectively. Thus, if the output potential is plotted with the azimuth angle $\theta$ plotted on the abscissa, the X-output and the Y-output are as shown in FIG. 10.

Thus the azimuth angle $\theta$ relative to the geomagnetism $H_E$ can be calculated from the X-output and Y-output.

That is, since the X-output and the Y-output are proportionate to $H_E \sin\theta$ and $H_E \cos\theta$, respectively, the ratio X/Y of the X-output and the Y-output may be represented by $\sin\theta/\cos\theta$, that is, $$X/Y = \sin\theta/\cos\theta = \tan\theta$$

Thus, $$\theta = \tan^{-1}(X/Y)$$

where $X \geq 0$ for $0 \leq \theta \leq 180°$ and $X < 0$ for $180° \leq \theta < 360°$.

The azimuth angle $\theta$ of the geomagnetism $H_E$ can be known by the above process. The principle of converging the flux of the geomagnetism by the magnetic cores $K_1$, $K_2$, $K_3$ and $K_4$ is now explained.

Figure 11:
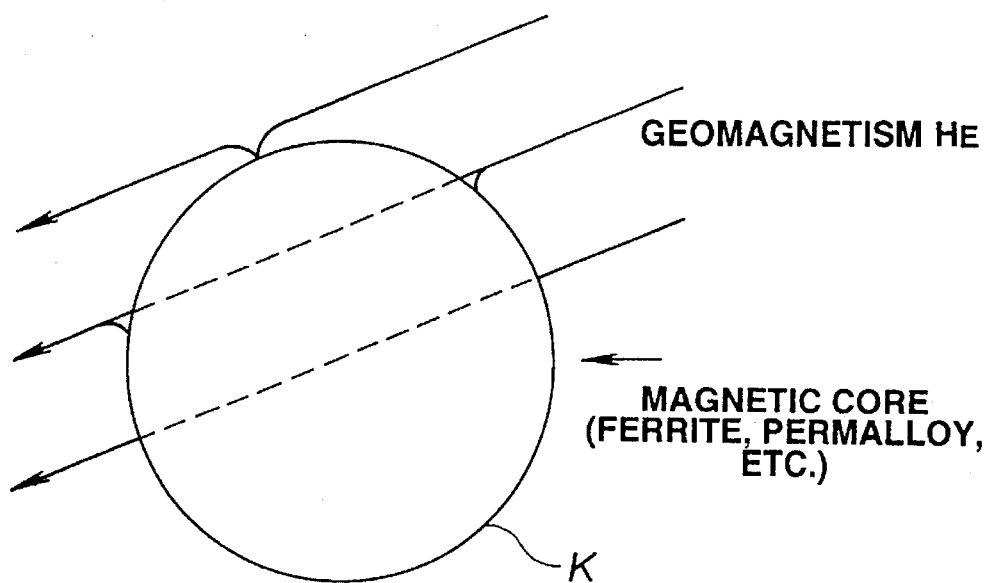
FIG. 11 is a schematic view showing the state of convergence of geomagnetic flux by a magnetic core of the direction sensor.

FIG. 11 schematically shows how the geomagnetism is affected by the magnetic core K formed of a magnetic material, such as ferrite or permalloy.

Since the magnetic material has a magnetic reluctance lower than that of air, the geomagnetism is bent in its course as if it were attracted by it. Thus, the geomagnetism is passed through the interior of the magnetic core K before again exiting to outside.

Thus, the magnetic core K converges geomagnetism to increase the magnetic flux density. In effect, the geomagnetism magnetizes the magnetic core K to produce a large magnetic field in the magnetic gap.

Figure 12:
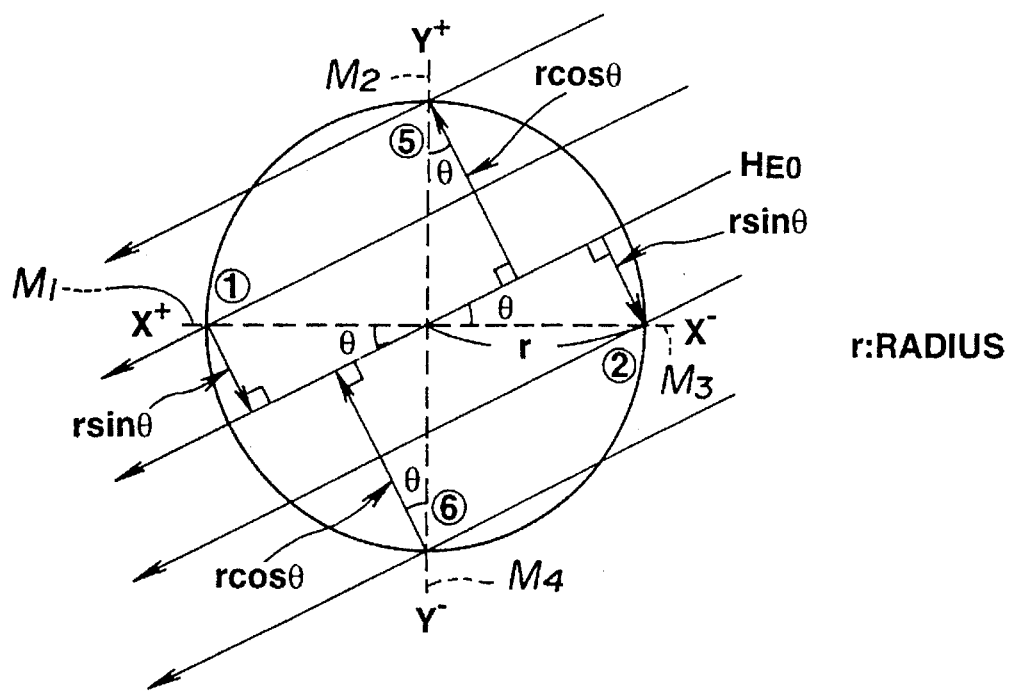
FIG. 12 is a schematic view showing the total quantity of geomagnetism applied to respective MR sensors when employing a circular core.

FIG. 12 shows how the geomagnetism is transmitted to the MR sensors $M_1$, $M_2$, $M_3$ and $M_4$ in a case of employing the circular-shaped magnetic core K. The total quantity of the geomagnetism impressed as magnetic signals on the MR sensors $M_1$, $M_2$, $M_3$ and $M_4$ is equivalent to the lengths of lines drawn perpendicularly from the respective MR sensors $M_1$, $M_2$, $M_3$ and $M_4$ to a line of geomagnetism $H_{E0}$ passing through the center of the magnetic core K.

The quantity of the geomagnetism impressed on each of the MR sensors $M_1$, $M_3$ for the x-axis is equal to $r\sin\theta$, while the quantity of the geomagnetism impressed on each of the MR sensors $M_2$, $M_4$ for the y-axis is equal to $r\cos\theta$.

Thus the azimuth angle $\theta$ of the geomagnetism $H_E$ can be calculated in accordance with the above equation from the outputs of the geomagnetic direction sensor (X-output and Y-output) issued on the basis of the total quantities of the geomagnetism.

Figure 13:
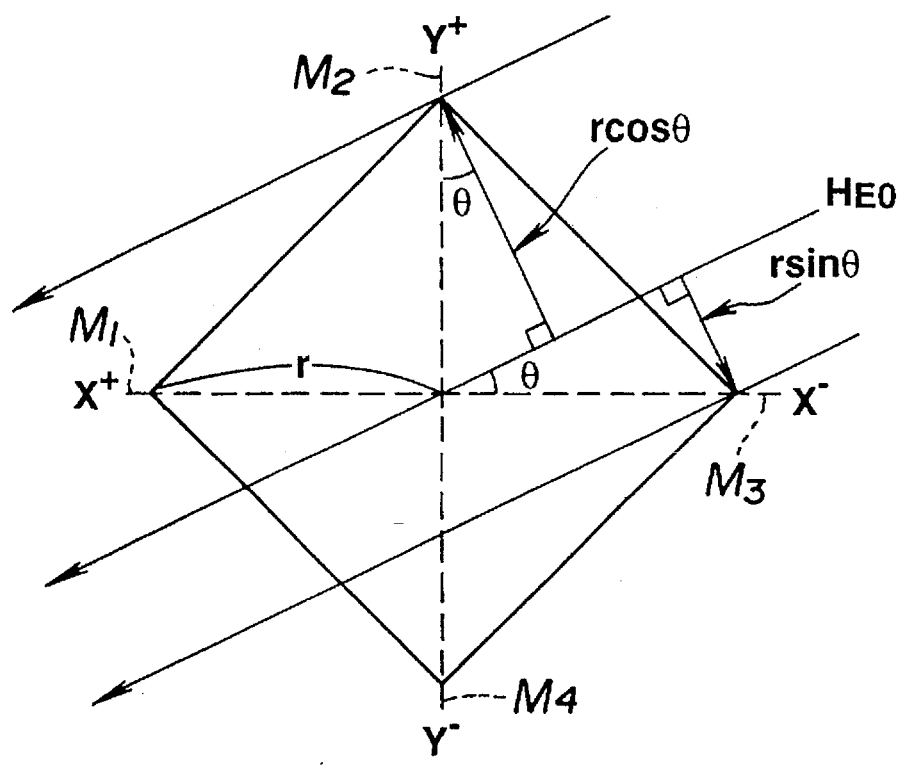
FIG. 13 is a schematic view showing the total quantity of geomagnetism applied to respective sensors when employing a square-shaped core.

The above holds true for the square-shaped magnetic core K, as shown in FIG. 13. In addition, similar outputs may be derived if the shape of the magnetic core is such that a symmetrical shape of the core is maintained on rotation thereof through 90° with the center of the magnetic core K as a center of rotation.

If the magnetic cores $K_1$ and $K_2$ operating as the cores for the excitation coils $C_1$, $C_2$ are formed of a soft magnetic material as explained above and employed as a converging hone for geomagnetic flux, the result is the increased output and improved sensitivity as compared to the case of employing an air-core coil or a magnet.

In addition, with the geomagnetic direction sensor, the magnetic cores $K_1$, $K_2$, $K_3$ and $K_4$ are connected to one another by the glass material charged into the magnetic gaps $G_1$, $G_2$, $G_3$ and $G_4$. Thus the geomagnetic direction sensor according to the present invention is of a simplified and compact construction since there is no necessity of providing respective magnetic cores $K_1$, $K_2$, $K_3$ and $K_4$ on an underlying substrate with a pre-set gap and the magnetic sensors $M_1$, $M_2$, $M_3$ and $M_4$ are arrayed in register with the gaps $G_1$, $G_2$, $G_3$ and $G_4$ of the magnetic cores $K_1$, $K_2$, $K_3$ and $K_4$ circumferentially arrayed on the sensor substrate 1 for converging the geomagnetic flux. Thus the relative positioning accuracy between the magnetic cores $K_1$, $K_2$, $K_3$ and $K_4$ and the magnetic sensors $M_1$, $M_2$, $M_3$ and $M_4$ is improved so that the bias magnetic field can be impressed on the MR sensors $M_1$, $M_2$, $M_3$ and $M_4$ accurately for enabling stable MR characteristics to be achieved. The result is that geomagnetism may be efficiently supplied to the MR sensors $M_1$, $M_2$, $M_3$ and $M_4$ to render it possible to achieve a high output and to detect the azimuth angle highly accurately.

Although the foregoing description has been made with reference to preferred embodiments of the present invention, it is to be understood that the present invention is not limited to these illustrative embodiments except as limited by the appended claims.

What is claimed is:

1. A geomagnetic direction sensor comprising:

a substrate having a plurality of cores of a magnetic material for converging geomagnetism, said cores being arrayed circumferentially of said substrate and being interconnected by a non-magnetic material for defining pre-set gaps therebetween;

detection means for detecting changes in the magnetic field of the geomagnetism depending on magneto-resistive effects, said detection means being arrayed in registration with said gaps in said substrate so as to be substantially perpendicular to the direction of the magnetic field of the geomagnetism in said gaps for detecting changes in the magnetic field of the geomagnetism, said detection means including at least two magneto-resistive devices operatively arrayed on said substrate; and an excitation coil for impressing the bias magnetic field on at least one of said magneto-resistive device.

2. The geomagnetic direction sensor as claimed in claim 1, wherein said at least two magneto-resistive devices are arrayed substantially perpendicularly to each other on said substrate.

3. The geomagnetic direction sensor as claimed in claim 2, wherein a non-magnetic film is further provided on said substrate and said magneto-resistive effect device is provided on said substrate with the non-magnetic film in-between.

4. The geomagnetic direction sensor as claimed in claim 3, wherein said non-magnetic film is formed of silicon oxide.

5. The geomagnetic direction sensor as claimed in claim 2, wherein said excitation coil is wound about at least one of said cores and wherein the current is supplied to said excitation coil for impressing the bias magnetic field to said magneto-resistive effect devices.

6. The geomagnetic direction sensor as claimed in claim 1, wherein said non-magnetic material is a glass material.

7. The geomagnetic direction sensor as claimed in claim 1, wherein said magnetic cores are formed of a soft magnetic material.

8. The geomagnetic direction sensor as claimed in claim 1, wherein said substrate is of a shape which becomes symmetrical on rotation through 90°.

9. A geomagnetic direction sensor comprising;

a substrate having a plurality of cores of a magnetic material for converging geomagnetism and having a shape which remains symmetrical on rotation, said cores being arrayed circumferentially of said substrate and being interconnected by a non-magnetic material for defining pre-set gaps therebetween, and at least two magneto-resistive devices arrayed substantially perpendicularly to each other on said substrate, said magneto-resistive effect devices being arrayed in register with the gaps of said substrate so as to be substantially perpendicular to the direction of the magnetic field of the geomagnetism in said gaps, and bias magnetic field generating means provided on said substrate for impressing a bias magnetic field to said magneto-resistive effect device.

10. The geomagnetic direction sensor as claimed in claim 9, wherein a non-magnetic film is further provided on said substrate and said magneto-resistive effect device is provided on said substrate with the non-magnetic film in-between.

11. The geomagnetic direction sensor as claimed in claim 9, wherein said non-magnetic material is a glass material.

12. The geomagnetic direction sensor as claimed in claim 9, wherein the geomagnetic direction sensor finds the azimuth angle of the geomagnetism θ in accordance with an equation $$\theta = \tan^{-1}(X/Y)$$

where X and Y denote output signals of said magneto-resistive effect devices, and outputs the calculated azimuth angle θ.

13. A method for producing a geomagnetic direction sensor comprising the steps of:

forming plural grooves on one major surface of a plate-shaped member formed of a magnetic material, charging a non-magnetic material in said grooves, grinding a major surface of the plate-shaped member opposite to the one major surface in which said grooves have been formed, forming a plurality of magneto-resistive effect devices on said one major surface of said plate-shaped member, winding a coil for applying a bias magnetic field to said magneto-resistive effect device of each geomagnetic direction sensor, and severing said plate-shaped member into a plurality of the geomagnetic azimuth sensors each including at least one of said magnetoresistive devices.

14. The method as claimed in claim 13, wherein the step of winding a coil for applying a bias magnetic field to said magneto-resistive effect device is applied to each geomagnetic direction sensor sliced from said plate-shaped member.

15. An apparatus for use in making a geomagnetic direction sensor, comprising:

a substrate having a plurality of cores of a magnetic material for converging geomagnetism, said cores being arrayed circumferentially of said substrate and being interconnected by a non-magnetic material for defining pre-set gaps therebetween, and detection means, including at least two magneto-resistive devices, for detecting changes in the magnetic field of the geomagnetism depending on magneto-resistive effects, said detection means being arrayed in registration with said gaps in said substrate so as to be substantially perpendicular to the direction of the magnetic field of the geomagnetism in said gaps for detecting changes in the magnetic field of the geomagnetism; and bias magnetic field generating means provided on said substrate for impressing a bias magnetic field to said magneto-resistive devices.

16. The geomagnetic direction sensor as claimed in claim 1, wherein said at least two magneto-resistive devices are arrayed substantially perpendicularly to each other on said substrate.

17. The geomagnetic direction sensor as claimed in claim 16, wherein a non-magnetic film is further provided on said substrate and said magneto-resistive effect device is provided on said substrate with the non-magnetic film in-between.

18. The geomagnetic direction sensor as claimed in claim 17, wherein said non-magnetic film is formed of silicon oxide.

19. The geomagnetic direction sensor as claimed in claim 16, wherein said bias field generating means for the sensor has an excitation coil wound about at least one of said cores and wherein the current is supplied to said excitation coil for impressing the bias magnetic field to at least one of said magneto-resistive effect devices.

20. The geomagnetic direction sensor as claimed in claim 15, wherein said non-magnetic material is a glass material.

21. The geomagnetic direction sensor as claimed in claim 15, wherein said magnetic cores are formed of a soft magnetic material.

22. The geomagnetic direction sensor as claimed in claim 15, wherein said substrate is of a shape which becomes symmetrical on rotation through 90°.

* * * * *